(12) United States Patent
Hayakawa

(10) Patent No.: US 7,919,767 B2
(45) Date of Patent: Apr. 5, 2011

(54) SEMICONDUCTOR MEMORY DEVICE AND FABRICATION METHOD THEREOF

(75) Inventor: Tsutomu Hayakawa, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 258 days.

(21) Appl. No.: 11/812,752

(22) Filed: Jun. 21, 2007

(65) Prior Publication Data

US 2008/0006813 A1    Jan. 10, 2008

(30) Foreign Application Priority Data

Jun. 22, 2006  (JP) .................................. 2006-172077

(51) Int. Cl.
*H01L 47/00* (2006.01)
(52) U.S. Cl. ...................... 257/4; 438/54; 257/E21.649
(58) Field of Classification Search ........ 257/4, E21.649
See application file for complete search history.

(56) References Cited

U.S. PATENT DOCUMENTS

| 6,740,921 | B2 | 5/2004 | Matsuoka et al. |
| 6,815,705 | B2 | 11/2004 | Klersy et al. |
| 7,173,271 | B2 | 2/2007 | Chang |
| 2003/0047762 | A1* | 3/2003 | Lowrey ........................ 257/276 |
| 2003/0071289 | A1* | 4/2003 | Hudgens et al. ............... 257/246 |
| 2004/0188735 | A1 | 9/2004 | Hideki |
| 2004/0195604 | A1* | 10/2004 | Hwang et al. ................. 257/295 |
| 2005/0111247 | A1* | 5/2005 | Takaura et al. .................... 365/2 |
| 2005/0185444 | A1 | 8/2005 | Yang et al. |
| 2006/0006374 | A1 | 1/2006 | Chang |
| 2006/0113520 | A1 | 6/2006 | Yamamoto et al. |

FOREIGN PATENT DOCUMENTS

| JP | 2003-249626 | 9/2003 |
| JP | 2004-274055 | 9/2004 |
| JP | 2006-19688 | 1/2006 |
| JP | 2006-120751 | 5/2006 |
| JP | 2006-156886 | 6/2006 |
| WO | WO 03/023875 | 3/2003 |

OTHER PUBLICATIONS

Japanese Office Action dated Apr. 16, 2008 with partial English translation.
Japanese Office Action dated Aug. 11, 2009 with a partial English Translation.

* cited by examiner

*Primary Examiner* — Ajay K Arora
(74) *Attorney, Agent, or Firm* — McGinn IP Law Group, PLLC

(57) ABSTRACT

A semiconductor memory device comprises a heater electrode, a phase change portion, a heat insulation portion and an upper electrode. The phase change portion comprises a concave portion and a contact portion. The concave portion is in contact with the heater electrode. The contact portion is formed integrally with the concave portion. The heat insulation portion is formed in the concave portion. The upper electrode is formed on the contact portion and the heat insulation portion so that the heat insulation portion is positioned between the concave portion and the upper electrode.

7 Claims, 21 Drawing Sheets

SEMICONDUCTOR MEMORY DEVICE AND FABRICATION METHOD THEREOF

BACKGROUND OF THE INVENTION

This invention relates to a semiconductor memory device and, in particular, to a phase change memory device and to a forming method thereof.

A phase change memory device is disclosed in, for example, US 2005/0185444 A1, U.S. Pat. No. 6,740,921 B2 or U.S. Pat. No. 6,815,705 B2, these documents being incorporated herein by reference in their entireties.

There is a need for a phase change memory device that can effectively supply heat with its phase change portion and can be fabricated easily.

SUMMARY OF THE INVENTION

According to one aspect of the present invention, a semiconductor memory device such as a phase change memory device comprises a heater electrode, a phase change portion, a heat insulation portion and an upper electrode. The phase change portion comprises a concave portion and a contact portion. The concave portion is in contact with the heater electrode. The contact portion is formed integrally with the concave portion. The heat insulation portion is formed in the concave portion. The upper electrode is formed on the contact portion and the heat insulation portion so that the heat insulation portion is positioned between the concave portion and the upper electrode.

An appreciation of the objectives of the present invention and a more complete understanding of its structure may be had by studying the following description of the preferred embodiment and by referring to the accompanying drawings.

Figure 1:
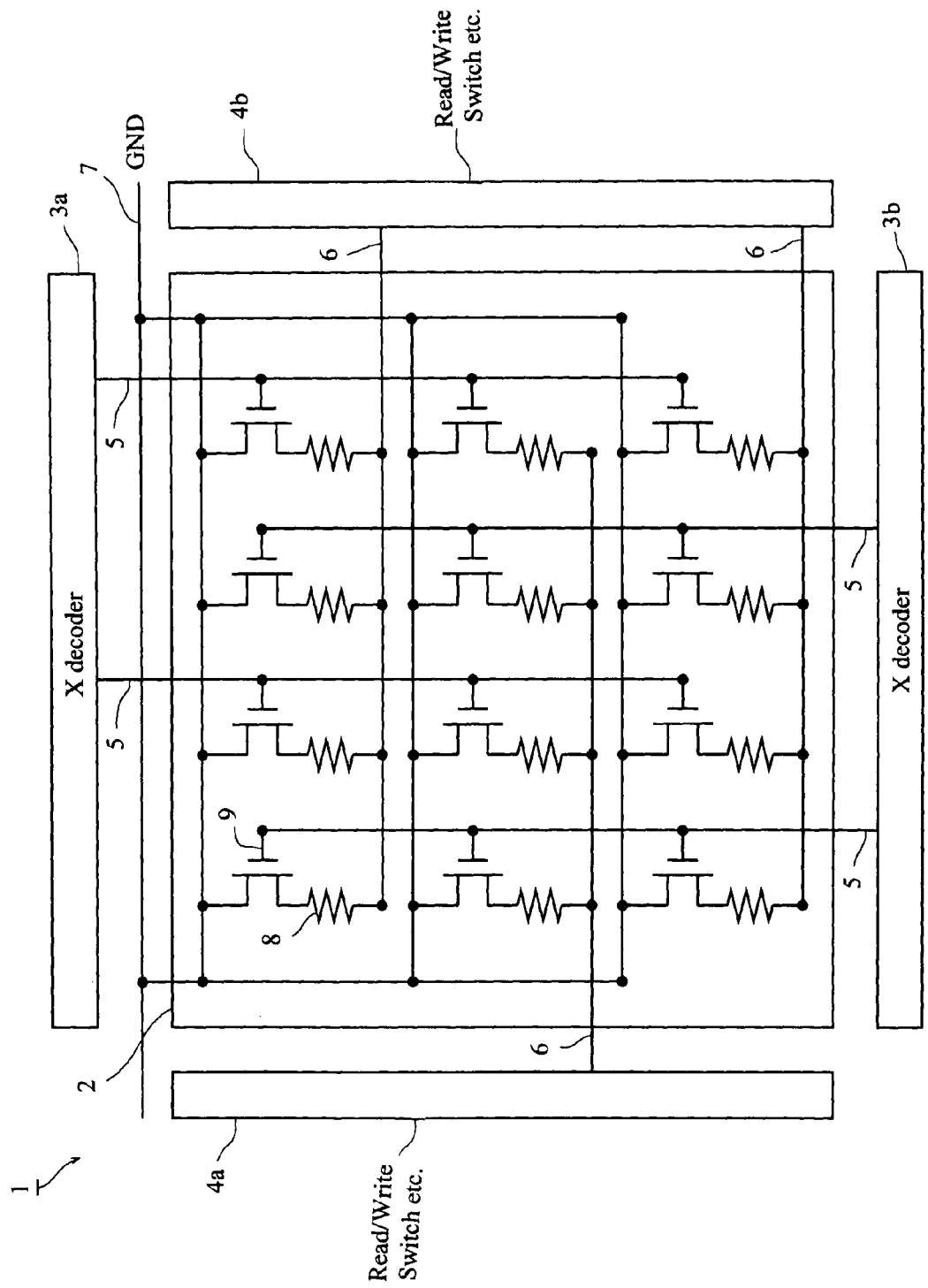
FIG. 1 is a view schematically showing in part a phase change memory device in accordance with an embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

With reference to FIG. 1, a phase change memory device 1 according to a first embodiment of the present invention comprises a memory cell array 2, X decoders 3a, 3b, read/write switch blocks 4a, 4b, gate lines 5, bit lines 6, ground lines 7 and various circuit around them (not shown).

The memory cell array 2 is arranged between the X decoders 3a, 3b and also between the read/write switch blocks 4a, 4b. Each of the gate lines 5 extends from the X decoder 3a or 3b over the memory cell array 2. Each of the bit lines 6 extends from the read/write switch block 4a or 4b over the memory cell array 2 so that the bit lines 6 intersect the gate lines 5 as see from the above. The ground lines 7 are to be supplied with a ground level voltage and is formed throughout the memory cell array 2.

The memory cell array 2 is constituted by a plurality of memory cells, which are arranged in a matrix form. Each of the memory cells is comprised of a resistor 8 and a transistor 9. The gate electrode of the transistor 9 is coupled to one of the gate lines 5. The drain electrode of the transistor 9 is coupled to one end of the corresponding resistor 8. The source electrode of the transistor 9 is coupled to the ground line 7. The other end of the corresponding resistor 8 is coupled to one of the bit lines 6.

The resistor 8 is made of a phase change material. One of phase change materials is a chalcogenide material including at least one chalcogen element such as sulfur (S), selenium (Se), and tellurium (Te); one of typical chalcogenide materials is $Ge_xSb_yTe_z$ (GST). Another material of $As_xSb_yTe_z$, $Ta_xSb_yTe_z$, $Nb_xSb_yTe_z$, $V_xSb_yTe_z$, $Ta_xSb_yTe_z$, $Nb_xSb_ySe_z$, $V_xSb_ySe_z$, $W_xSb_yTe_z$, $Mo_xSb_yTe_z$, $Cr_xSb_yTe_z$, $W_xSb_ySe_z$, $Mo_xSb_ySe_z$, $Cr_xSb_ySe_z$, or $Sn_xSb_yTe_z$ may be used. The phase change material such as chalcogenide material can have two different states, an amorphous state and a crystalline state, in response to temperature applied thereto. The amorphous state and the crystalline state have different resistances from each other. The different resistances are utilized for storing data "0" and "1" in each memory cell, respectively.

Figure 3:
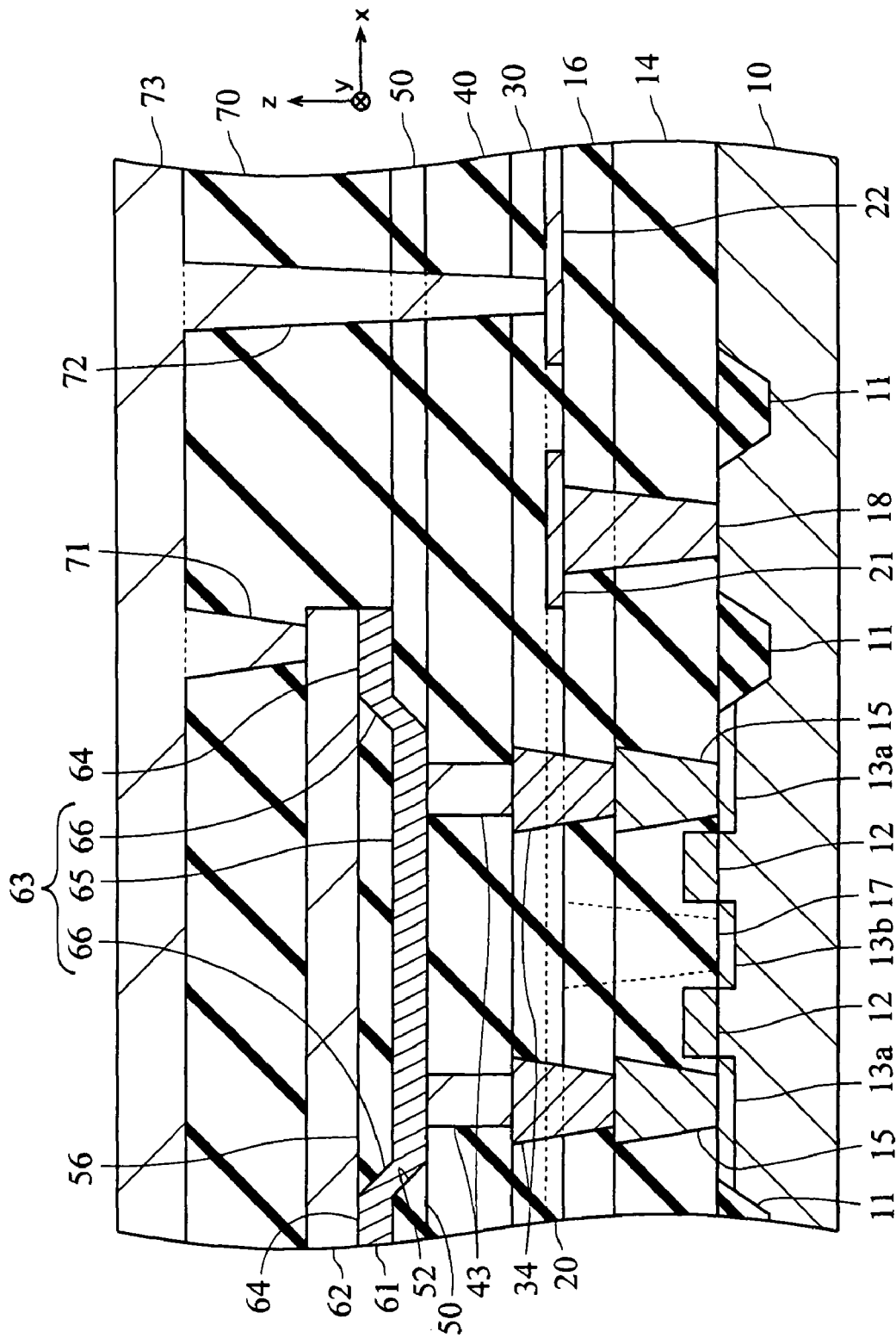
FIG. 3 is a cross-sectional view showing the phase change memory taken along with lines III-III of FIG. 2.

With reference to FIG. 3, the phase change memory device 1 of this embodiment comprises a semiconductor substrate 10, in which transistors are formed. Each of the transistors has a gate electrode 12, a drain region 13a and a source region 13b and is electrically isolated by a shallow trench isolation (STI) region 11 from contact plugs 18 for peripheral circuits or the like.

On the semiconductor substrate 10, an insulator layer 14 is formed. In the insulator layer 14, cell contact plugs 15 are formed to be coupled on the drain regions 13a of the transistors, respectively. On the insulator layer 14, another insulator layer 16 is formed. On the insulator layer 16, ground lines 20 and other conductive lines 21, 22 are formed. The ground lines 20 are coupled to the source regions 13b by means of ground contact plugs 17 each of which pierces through the insulator layers 14, 16. Likewise, the conductive lines 21 are coupled to particular regions of the semiconductor substrate 10 by means of the contact plugs 18 piercing through the insulator layers 14, 16. On the insulator layer 16 as well as the ground lines 20 and the conductive lines 21, 22, yet another insulator layer 30 is formed. Middle contact plugs 34 are formed to pierce the insulator layers 30, 16. The middle contact plugs 34 are connected to the cell contact plugs 15.

On the insulator layer 30, still another insulator layer 40 is formed. In the insulator layer 40, heater pillars 43 serving as heater electrodes are formed. The illustrated heater pillars 43 are made of titanium nitride (TiN). On the insulator layer 40, another insulator layer 50 is formed. The insulator layer 50 is formed with holes 52, in each of which a concave portion 63 of a corresponding phase change portion 61 is formed. In this embodiment, each concave portion 63 is connected to two heater pillars 43, as understood from FIGS. 2 and 3. In detail, the concave portion 63 has a plate-like bottom portion 65 and a wall portion 66. The bottom portion 65 is formed on the insulator layer 40 and the heater pillars 34. The bottom portion 65 has a size sufficiently larger than an area on which the heater pillars 34 and the bottom portion 65 are in contact with each other. The wall portion 66 is formed along an inner surface of the hole 52 and is tapered towards an edge of the bottom portion 65 so that the bottom portion 65 has an area smaller than another area defined by the rim of the concave portion, i.e. the upper edge of the wall portion 66.

The phase change portion 61 further has a contact portion 64 coupled to the rim of the concave portion 63, i.e. an upper edge of the wall portion 66. The contact portion 64 is laid on the insulator layer 50 and is positioned away from the heater pillars 43 in an x-direction. In other words, the contact portion 64 does not overlap with the heater pillars 43 as seen from the above.

Figure 4:
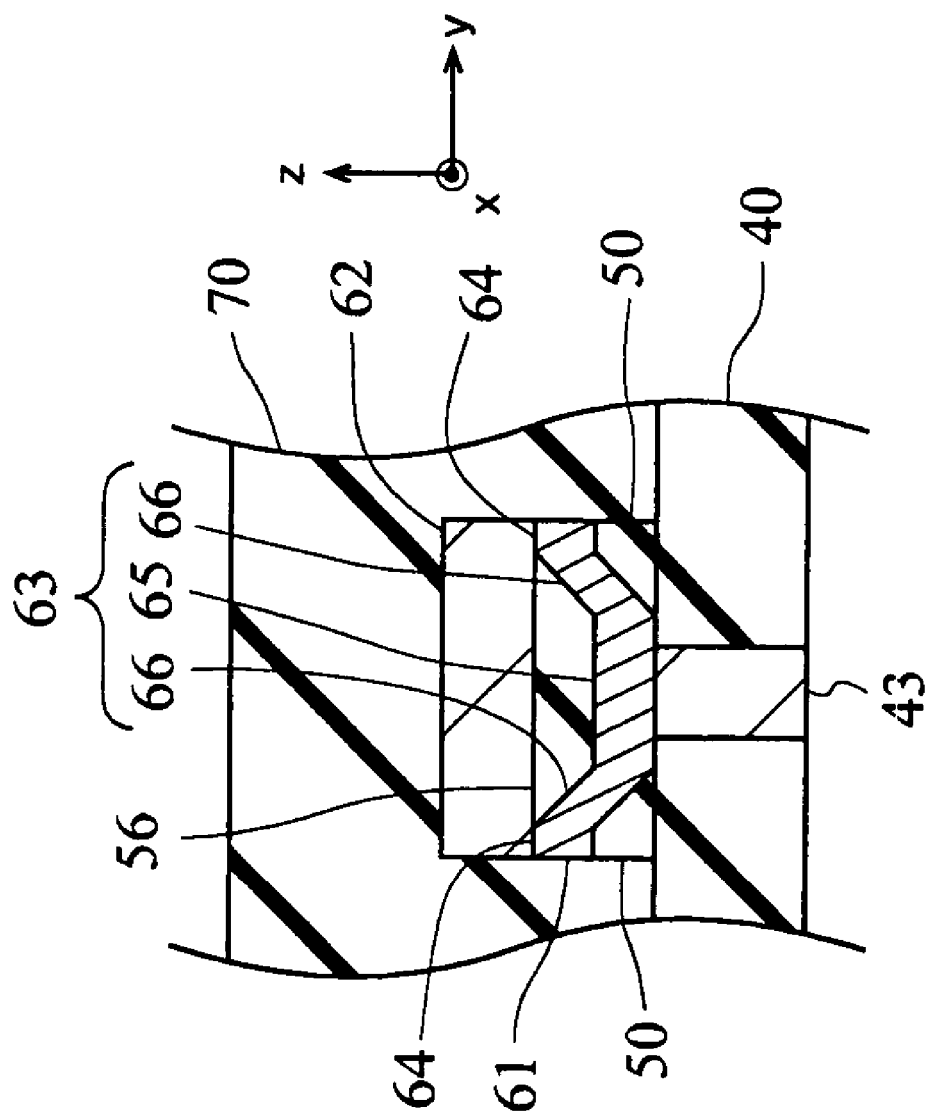
FIG. 4 is a cross-sectional view showing the phase change memory taken along with lines IV-IV of FIG. 2.

As apparent from FIGS. 3 and 4, each concave portion 63 has a rectangular shape as seen from the above. In this embodiment, each concave portion 63 has a longitudinal direction along the x-direction as understood from FIGS. 2 to 4. In addition, each contact portion 64 has a rectangular frame-like shape as seen from the above. In addition, neighboring contact portions 64 are coupled to each other in the x-direction to form a ladder-shaped contact portion extending in the x-direction. Furthermore, each phase change portion 61 has a plurality of concave portions 63 arranged along the x-direction; the concave portions 63 are coupled to each other by the ladder-shaped contact portion 64 in each phase change portion 61 that extends in the x-direction.

Figure 2:
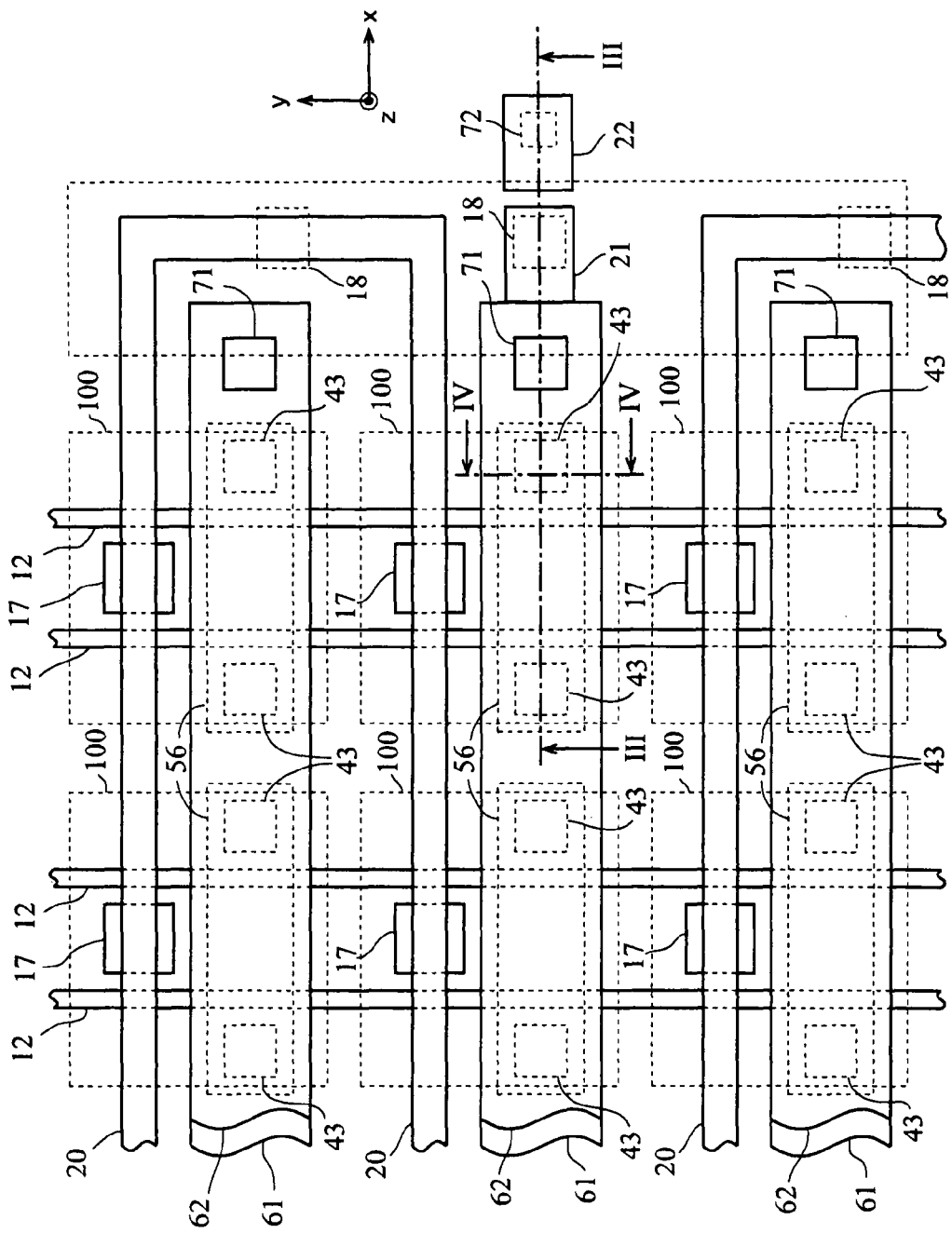
FIG. 2 is a view schematically showing in part a layout of the phase change memory device of FIG. 1.

With reference to FIGS. 2 to 4, heat insulation portions 56 are formed within the concave portions 63, respectively. In this embodiment, the heat insulation portion 56 has a top plane surface which is laid on the same level as the upper surface of the corresponding contact portion 64. The heat insulation portions 56 are made of a material having high heat resistance. Specifically, the illustrated heat insulation portions 56 are made of electrical-insulation material, especially, silicon oxide ($SiO_2$). Another electrical-insulation material such as silicon nitride (SiN) may be used. In addition, each heat insulation portion 56 may be comprised of two or more heat insulation layers stacked.

With reference to FIGS. 2 to 4, upper electrodes 62 are formed on the contact portions 64 and the heat insulation portions 56. In this embodiment, the upper electrodes 62 are made of tungsten (W). As shown in FIG. 2, each of the upper electrodes 62 extends along the x-direction. In this embodiment, the upper electrode 62 overlaps with the corresponding phase change portion 61, as best shown in FIG. 2. As apparent from FIGS. 2 to 4, two or more heat insulation portions 56 are positioned between one of the upper electrodes 62 and the corresponding one of the phase change portions 61, in this embodiment. Specifically, each of the illustrated heat insulation portions 56 is hermetically and completely enclosed or packed only by the phase change portion 61 and the upper electrode 62 corresponding thereto, so that the phase change portion 61 and the corresponding upper electrode 62 are in direct contact with each other only through the contact portion 64 of the phase change portion 61.

With reference to FIG. 3, another insulator layer 70 is formed on the upper electrode 64 and the insulator 50. On the insulator layer 70, a conductive line layer 73 is formed. As apparent from FIGS. 2 and 3, the conductive line layer 73 is electrically connected to the upper electrodes 62 via contact plugs 71, which are formed in the insulator 70. Likewise, the conductive layer 73 is also electrically connected to the conductive lines 22 through contact plugs 72, each of which pierces through the insulator layers 30, 40, 50, 70.

Next explanation will be made about a fabrication method of the above-described phase change memory device 1, with reference to FIGS. 5 to 19.

Figure 5:
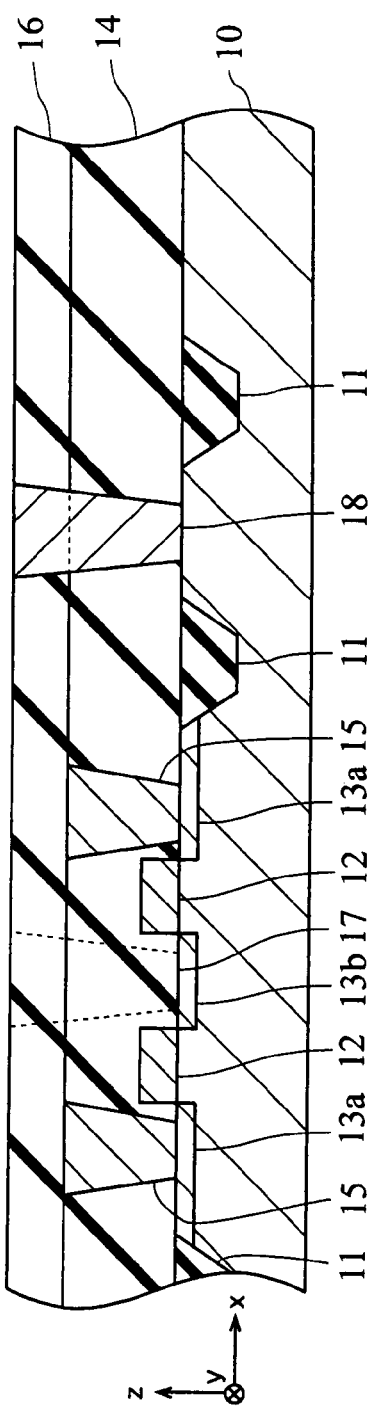
FIG. 5 is a cross-sectional view showing a fabrication process for the phase change memory device of FIG. 3.

As shown in FIG. 5, the STI region 11 is formed in the p-type semiconductor substrate 10 in a mesh form to define a plurality of field regions 100 (see FIG. 2). The illustrated STI region 11 has a thickness of 240 nm in a z-direction.

Next, a gate insulator film is formed on the semiconductor substrate 10 to have a thickness of 7 nm. On the gate insulator film, a doped poly-silicon layer and a tungsten silicide layer are deposited; the doped poly-silicon layer has a thickness of 100 nm; the tungsten silicide layer has a thickness of 100 nm. A mask is formed on the tungsten silicide layer through a photolithography technique. The doped poly-silicon layer and the tungsten silicide layer are exposed to an anisotropic etching to form the gate electrodes 12, as shown in FIG. 5. Each of the gate electrodes 12 extends in a y-direction. As shown in FIG. 2, two gate electrodes 12 extend over each field region 100.

Next, phosphorus (P) ions are implanted into the semiconductor substrate 10 by using the gate electrodes 12 as masks. Then, the semiconductor substrate 10 is exposed to a heat treatment process to form the drain regions 13a and the source regions 13b, wherein the drain regions 13a and the source regions 13b are of n-type.

Next, a tetra ethoxysilane (TEOS) material is deposited on the semiconductor substrate 10 to have a thickness of 700 nm. The TEOS material is exposed to a chemical mechanical polishing (CMP) process to be flattened. The flattened TEOS layer is the insulator layer 14. Contact holes are formed to pierce through the insulator layer 14 and to reach the drain regions 13a. Then, a doped poly-silicon layer is deposited on the insulator layer 14 including the contact holes and is subjected to a CMP process to be flattened. Thus, the cell contact plugs 15 are formed. In this embodiment, two cell contact plugs 15 are arranged in the x-direction within each field region 100.

On the insulator layer 14, a silicon oxide film of 200 nm is deposited as the insulator 16. Contact holes are formed to pierce through the insulator layers 14 and 16 and to reach the source regions 13b. On the insulator layer 16 including the contact holes, a titanium (Ti) layer of 10 nm, a titanium nitride (TiN) layer of 15 nm and a tungsten (W) layer of 250 nm are deposited in this order and are exposed to a CMP process to form the ground contact plugs 17. As apparent from FIGS. 2, 3 and 5, the ground contact plugs 17 and the cell contact plugs 15 are positioned away from each other in the y-direction. In this embodiment, the contact plugs 18 are also formed upon the formation of the ground contact plugs 17.

Figure 6:
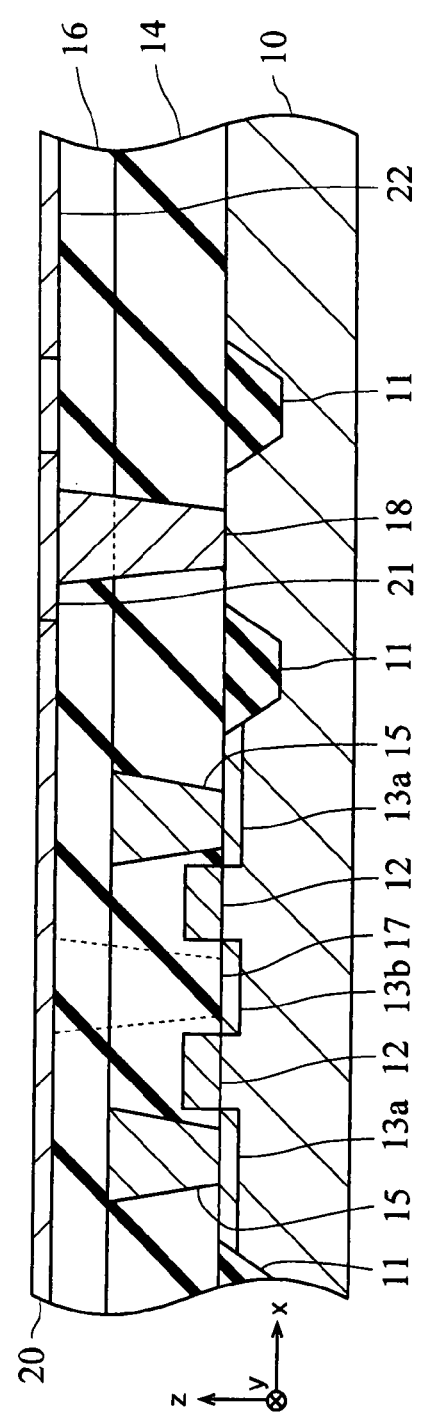
FIG. 6 is a cross-sectional view showing a subsequent fabrication process for the phase change memory device of FIG. 3.

Next, a tungsten (W) film of 50 nm is formed on the insulator layer 16 and is exposed to a patterning process to form the ground lines 20 electrically coupled to the ground contact plugs 17. The ground lines may be made of tungsten nitride (WN). In this embodiment, the conductive lines 21 and 22 are also formed upon the formation of the ground lines 20, as shown in FIG. 6.

Figure 7:
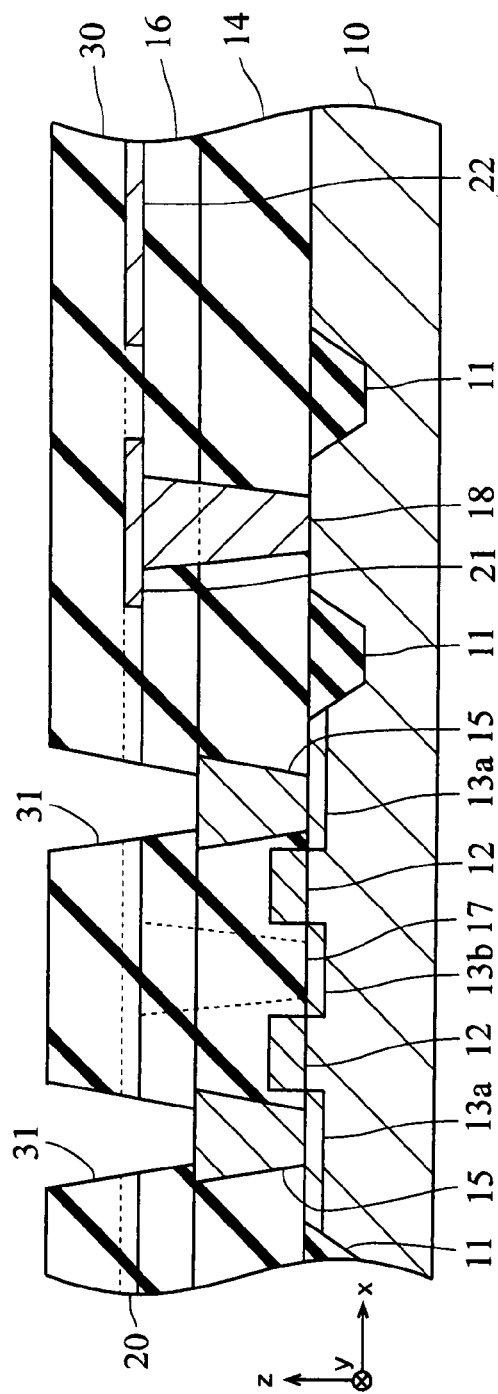
FIG. 7 is a cross-sectional view showing a subsequent fabrication process for the phase change memory device of FIG. 3.
Figure 8:
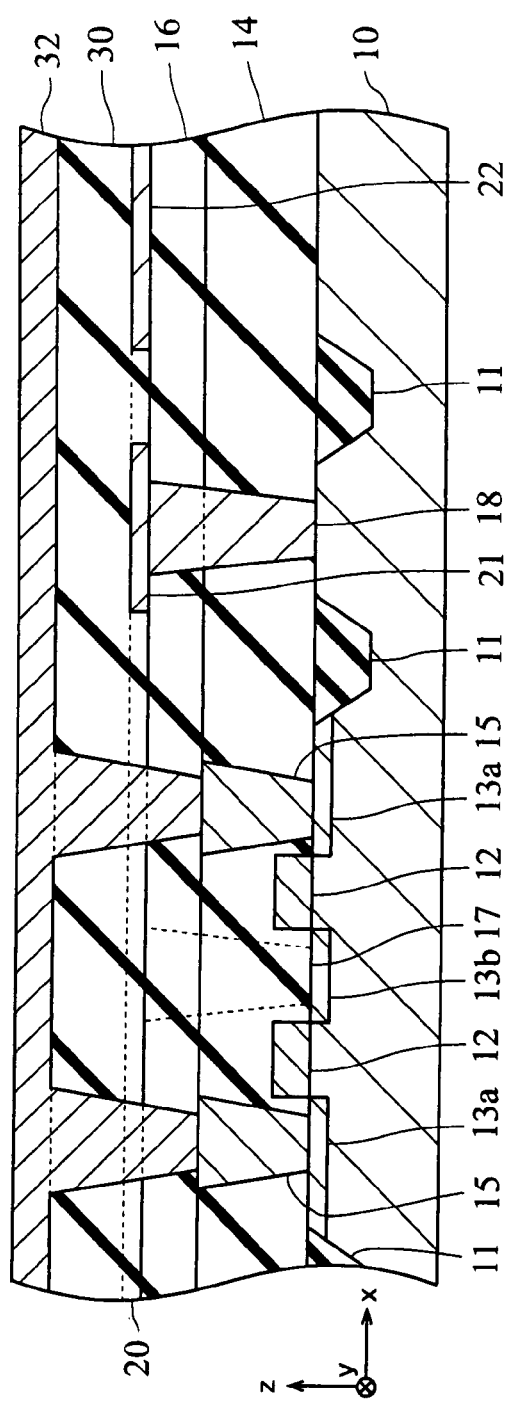
FIG. 8 is a cross-sectional view showing a subsequent fabrication process for the phase change memory device of FIG. 3.
Figure 9:
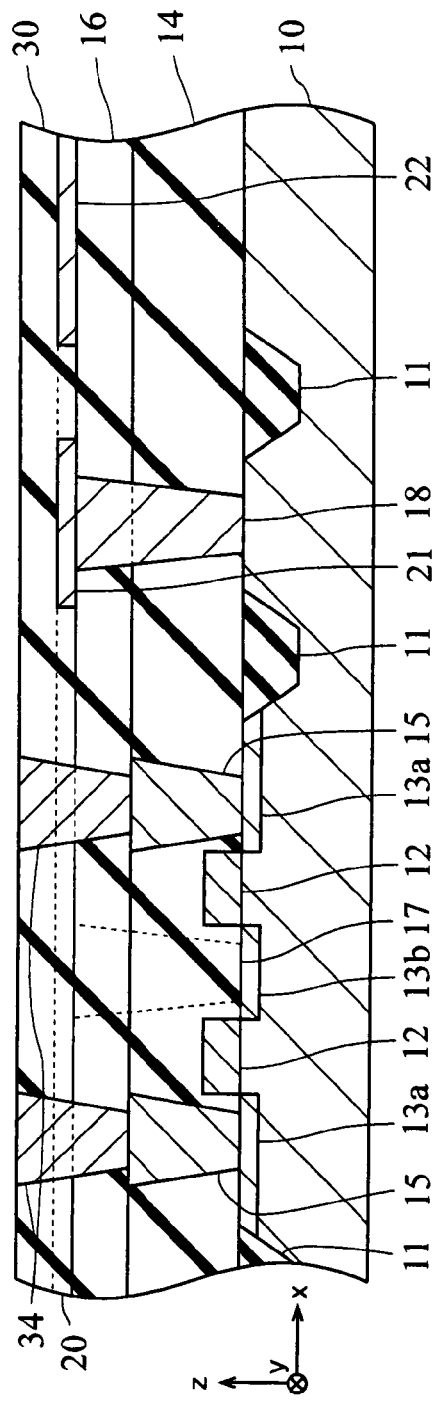
FIG. 9 is a cross-sectional view showing a subsequent fabrication process for the phase change memory device of FIG. 3.

Next, a silicon oxide layer of 500 nm is formed on the insulator layer 16 as well as the lines 20 to 22 and is exposed to a CMP process to form the insulator layer 30. As shown in FIG. 7, contact holes 31 are formed to pierce through the insulator layer 16 and the insulator layer 30 so that the cell contact plugs 15 can be seen through the contact holes 31, respectively. Then, a titanium (Ti) material of 10 nm and a titanium nitride (TiN) material of 50 nm are deposited in this order to form a contact material layer 32, as shown in FIG. 8. The contact material layer 32 is exposed to a CMP process up to the surface of the insulator layer 30 to form the middle contact plugs 34, as shown in FIG. 9.

Figure 10:
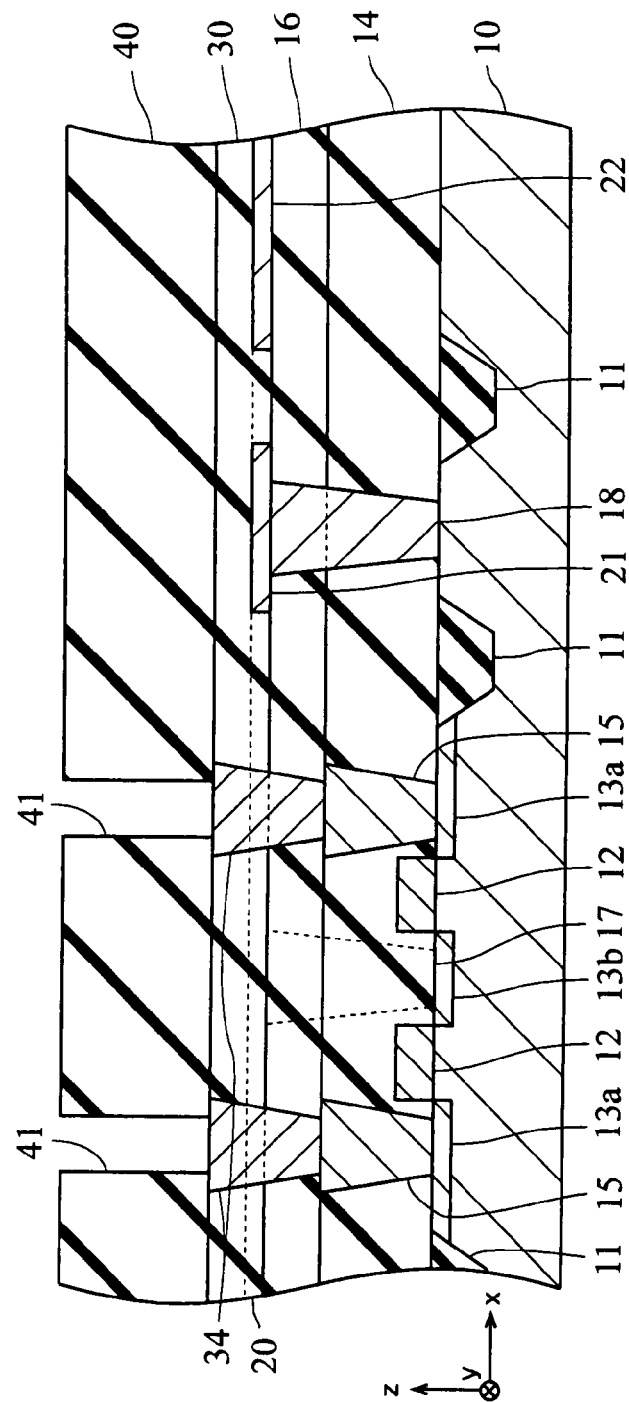
FIG. 10 is a cross-sectional view showing a subsequent fabrication process for the phase change memory device of FIG. 3.
Figure 11:
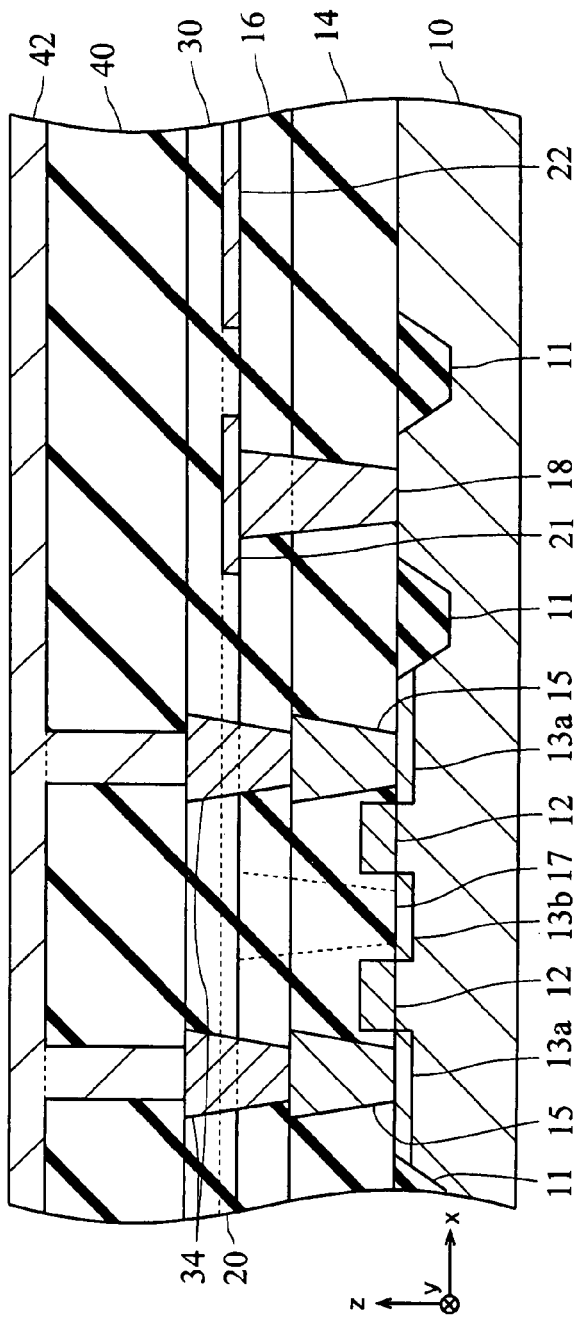
FIG. 11 is a cross-sectional view showing a subsequent fabrication process for the phase change memory device of FIG. 3.
Figure 12:
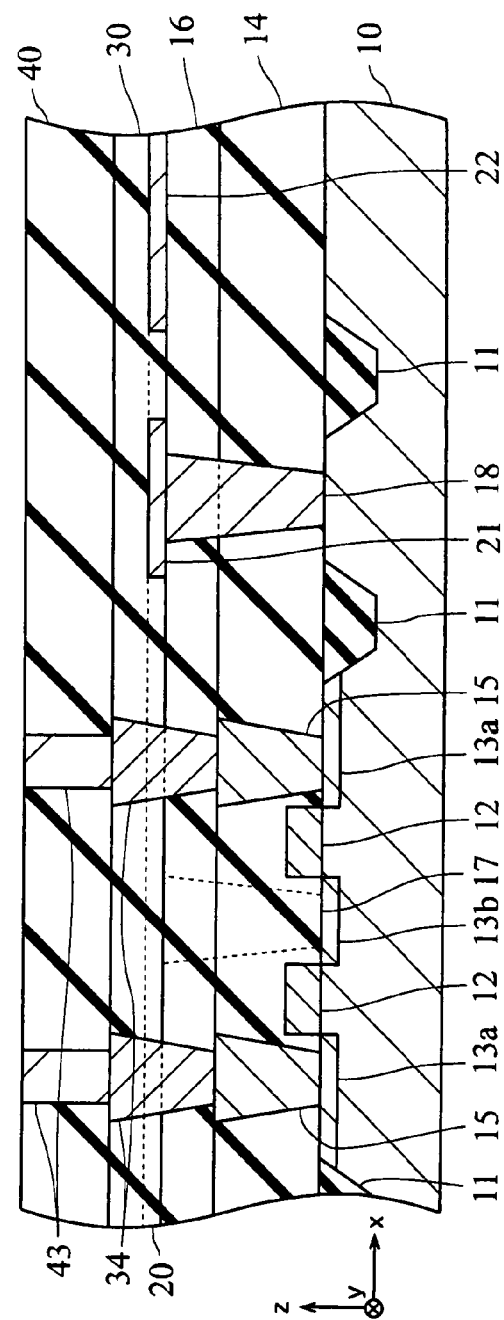
FIG. 12 is a cross-sectional view showing a subsequent fabrication process for the phase change memory device of FIG. 3.

Next, a silicon oxide material of 300 nm is deposited on the insulator layer 30 and the middle contact plugs 34 to form the insulator layer 40. In addition, contact holes 41 are formed to pierce through the insulator layer 40 and to reach the middle contact plugs 34, as shown in FIG. 10. A titanium nitride (TiN) material of 50 nm is deposited on the insulator layer 40 including the contact holes 41 to form a heater material layer 42, as shown in FIG. 11. The heater material layer 42 is exposed to a CMP process up to the surface of the insulator layer 40 to form the heater pillars 43, as shown in FIG. 12.

Figure 13:
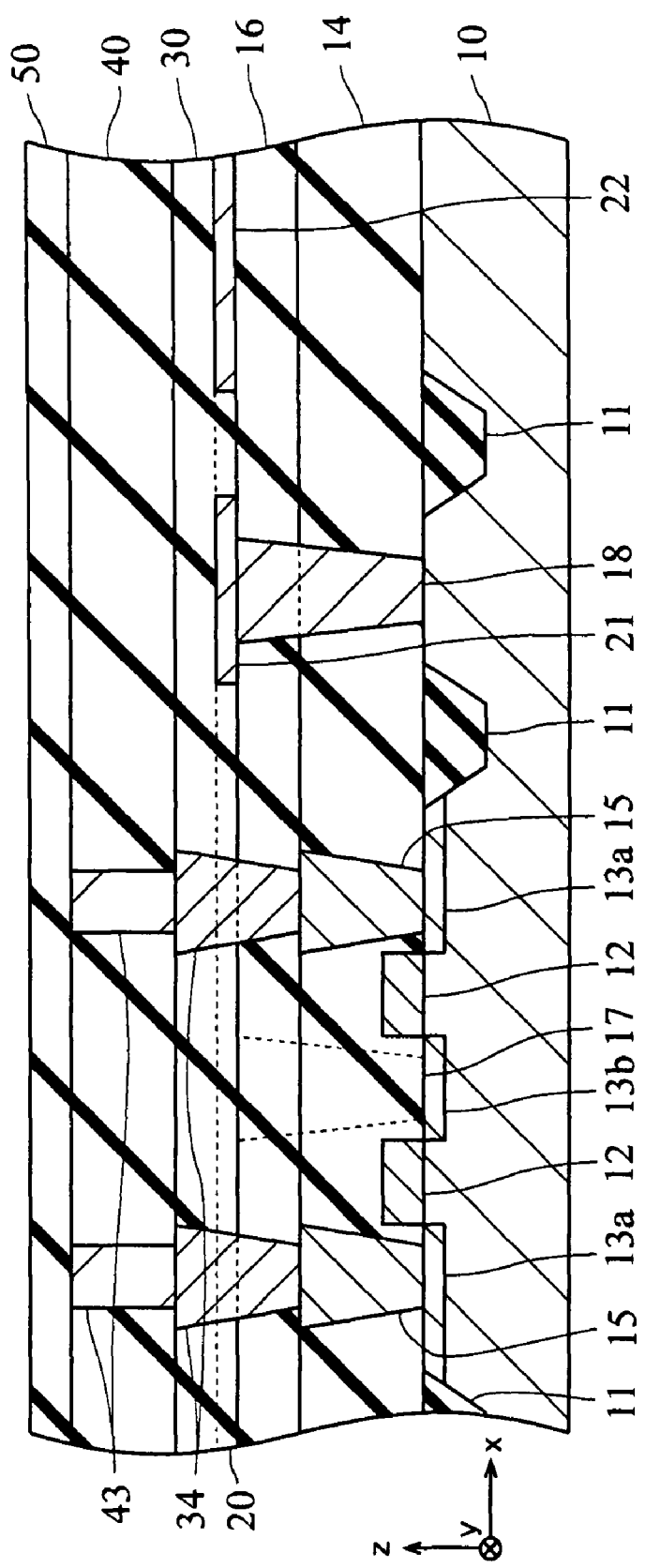
FIG. 13 is a cross-sectional view showing a subsequent fabrication process for the phase change memory device of FIG. 3.
Figure 14:
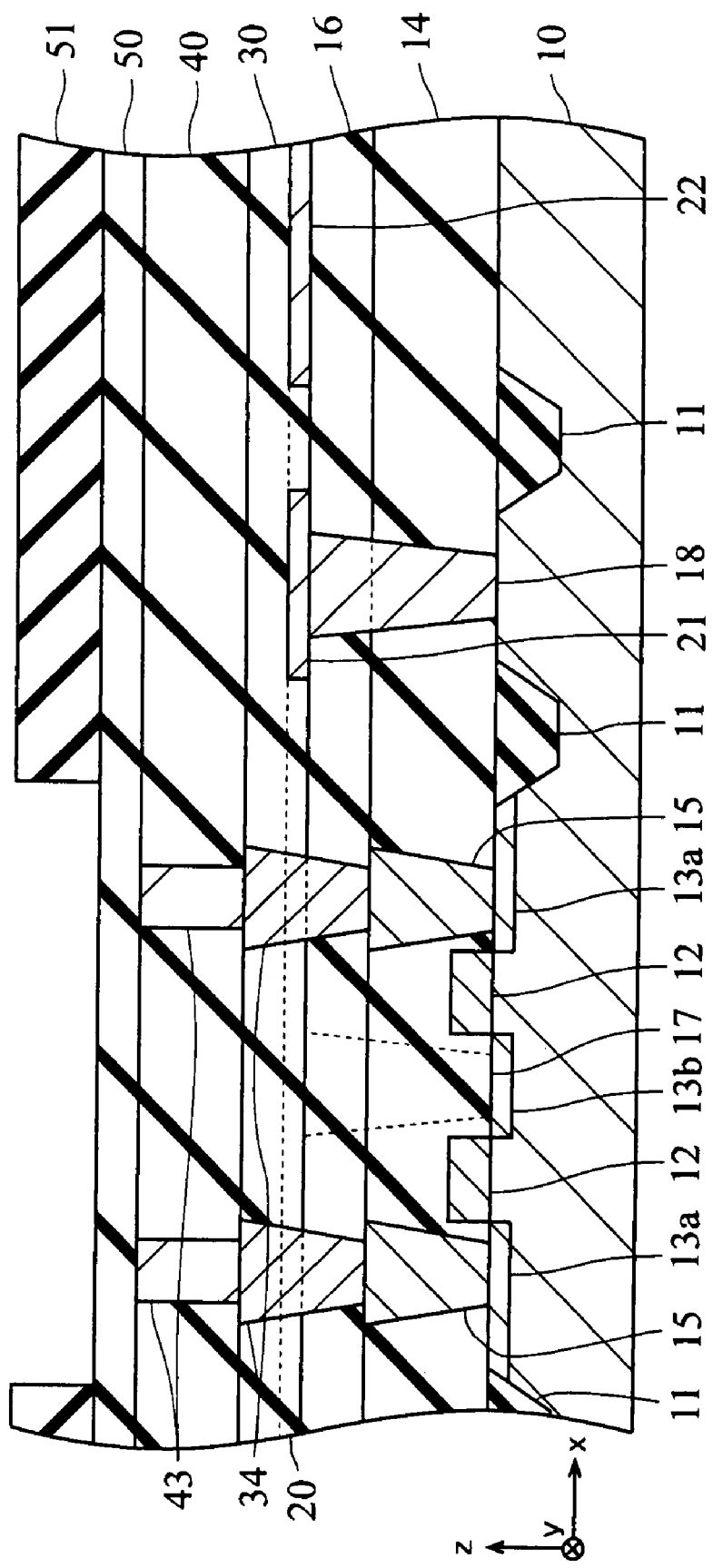
FIG. 14 is a cross-sectional view showing a subsequent fabrication process for the phase change memory device of FIG. 3.
Figure 15:
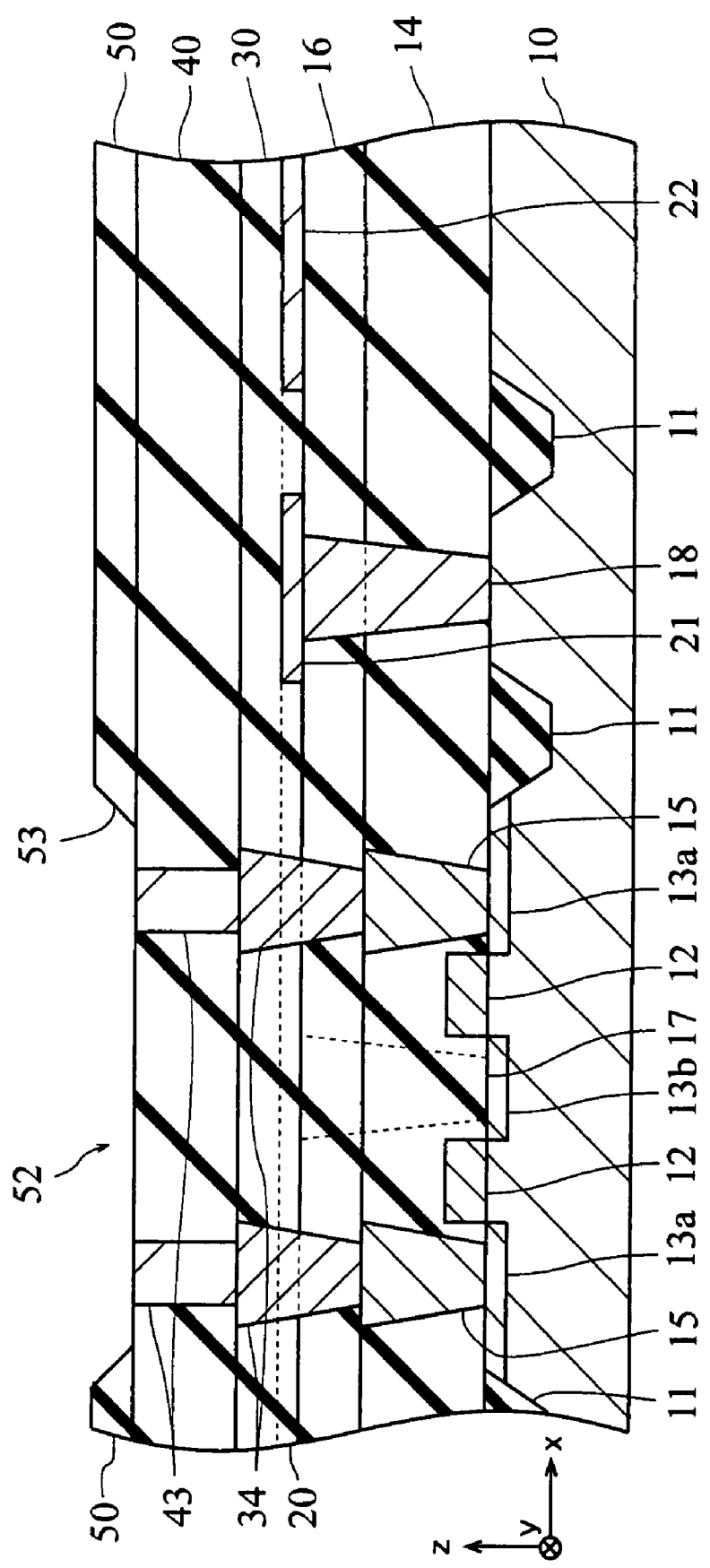
FIG. 15 is a cross-sectional view showing a subsequent fabrication process for the phase change memory device of FIG. 3.

Next, a silicon oxide film is formed as the insulator layer 50 on the insulator layer 40, as shown in FIG. 13. The insulator layer 50 preferably has a thickness of 10 nm to 200 nm, more preferably 50 nm. In this embodiment, the thickness of the insulator layer 50 is 50 nm. Next, a patterned resist layer 51 is formed on the insulator layer 50, wherein the patterned resist layer 51 has holes positioned above the heater pillars 43, as shown in FIG. 14. The insulator layer 50 is exposed to an etching process by using the patterned resist 51 as a mask, so that holes 52 are formed in the insulator layer 50 and that the tops of the heater pillars 43 can be seen from the above, as shown in FIG. 15. Each of the holes 52 has a tapered side surface 53 whose top edge defines an area larger than a bottom area of the hole 52.

Figure 16:
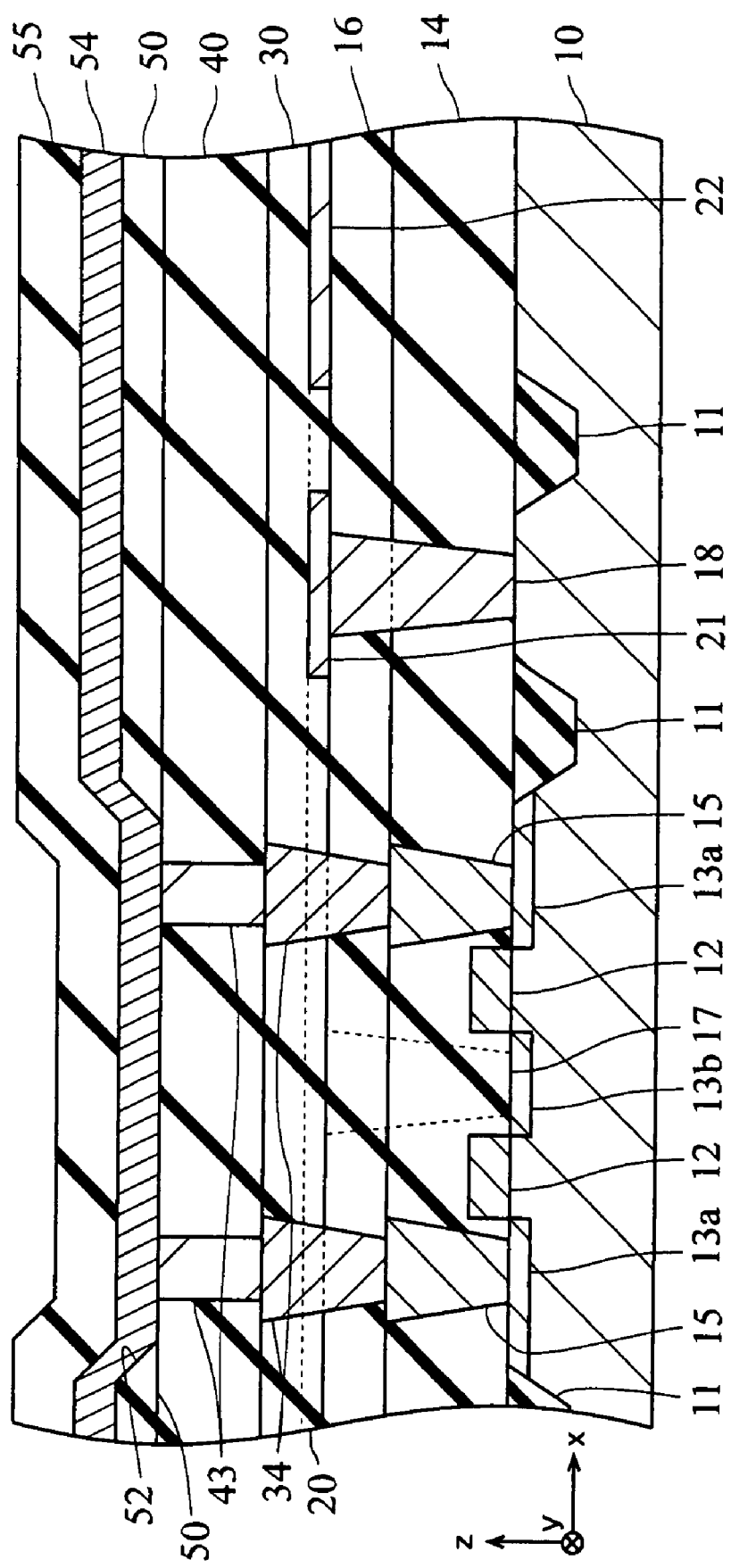
FIG. 16 is a cross-sectional view showing a subsequent fabrication process for the phase change memory device of FIG. 3.
Figure 17:
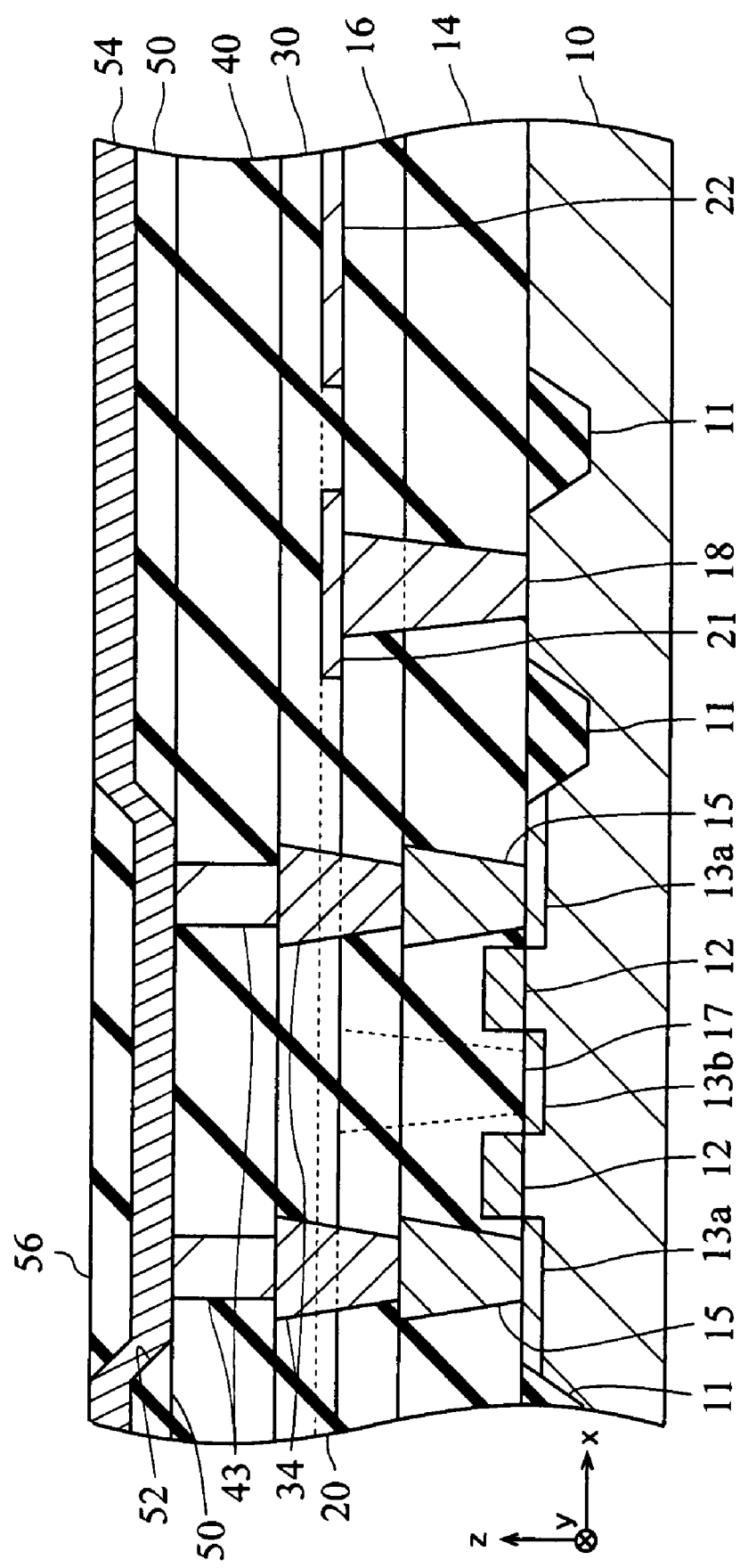
FIG. 17 is a cross-sectional view showing a subsequent fabrication process for the phase change memory device of FIG. 3.
Figure 18:
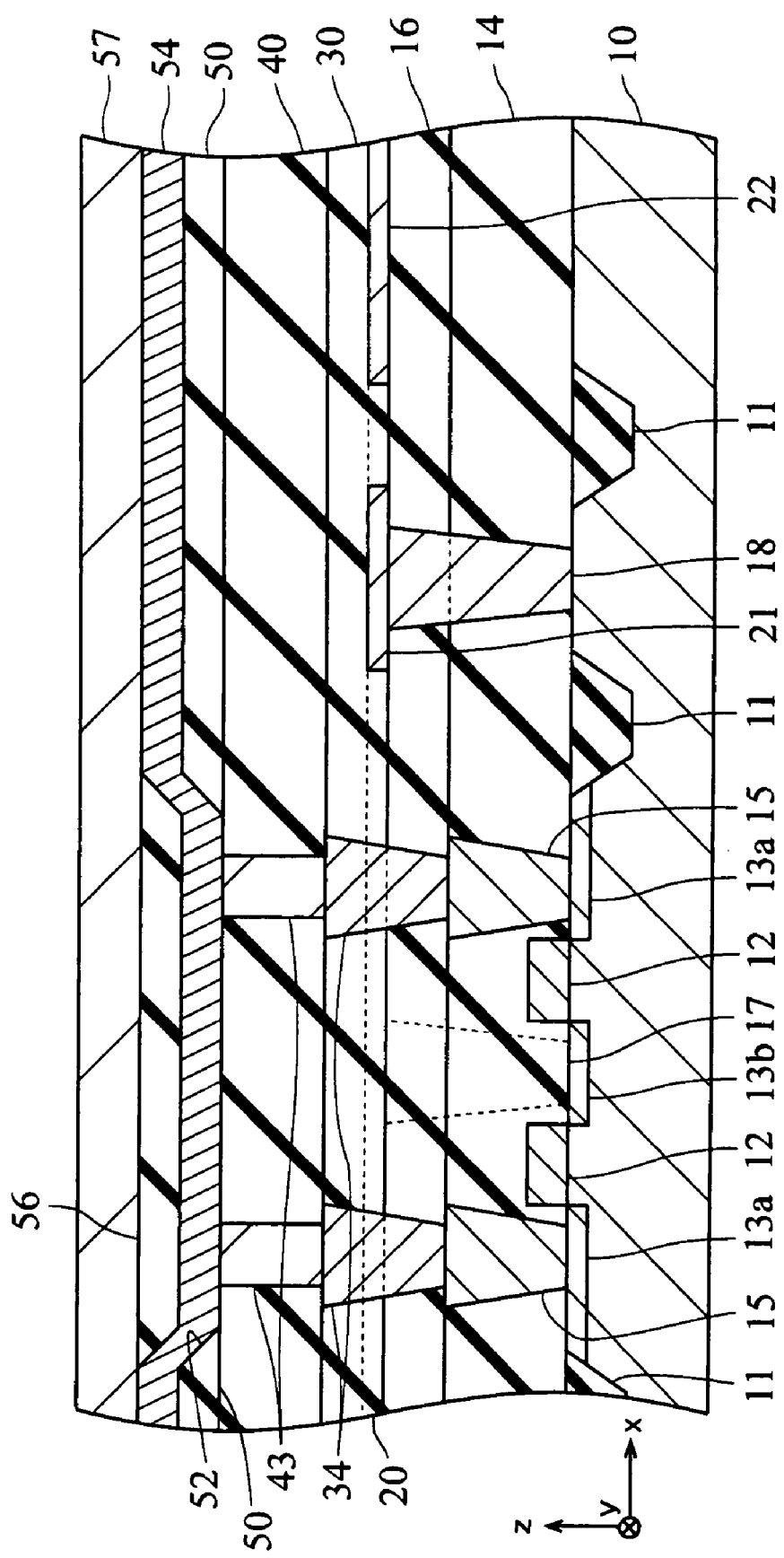
FIG. 18 is a cross-sectional view showing a subsequent fabrication process for the phase change memory device of FIG. 3.

Next, a GST material is deposited on the insulator layer 50 including the holes 52 to form the GST film 55. The GST film 55 preferably has a thickness of 25 nm to 100 nm, more preferably 100 nm. In this embodiment, the thickness of the GST film 55 is 100 nm. On the GST film 55, a silicon oxide film of 200 nm is deposited to form a heat insulation material layer 55, as shown in FIG. 16. The heat insulation material layer 55 is subjected to a CMP process up to the surface of the GST film 55 so that the heat insulation portions 56 are formed in the concave portions of the GST film 55, as shown in FIG. 17. The heat insulation portions 56 are surrounded by the GST film 55 as seen from the above. Over the heat insulation portions 56 and the GST film 55, a tungsten (W) layer of 50 nm is deposited to form an electrode material layer 57 as shown in FIG. 18.

Figure 19:
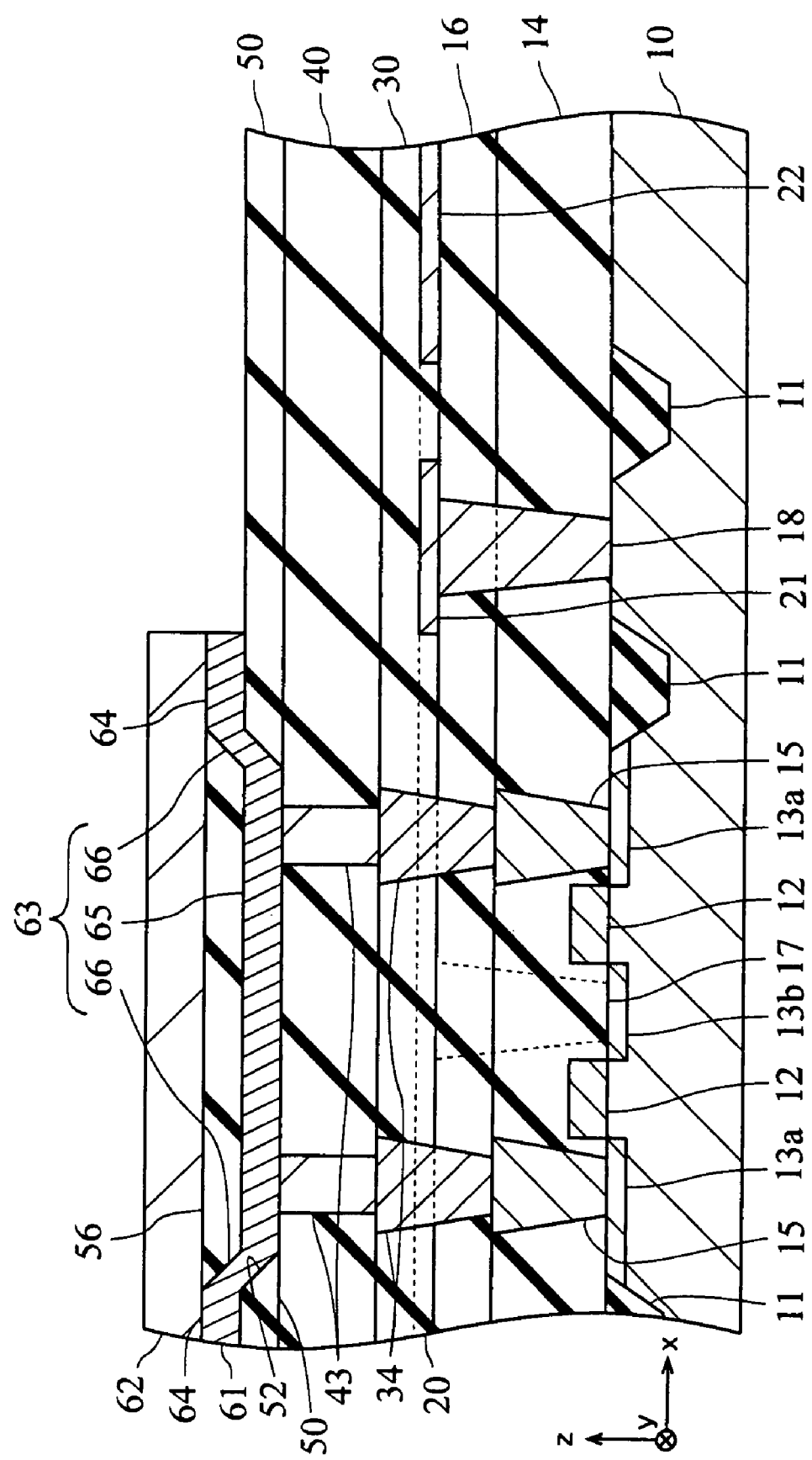
FIG. 19 is a cross-sectional view showing a subsequent fabrication process for the phase change memory device of FIG. 3.

Next, the electrode material layer 57 and the GST film 55 are exposed to a single etching process to form the upper electrodes 62 and the phase change portions 61, as shown in FIGS. 2 and 19. Each of the phase change portions 61 has the concave portions 63 and the contact portion 61, as described above. Each concave portion 63 has the plate-like bottom portion 65 and the tapered wall 66 due to the shape of the corresponding hole 52.

Next, the insulator layer 70 is formed on the upper electrodes 62 and the insulator layer 50. Then, the contact plugs 71 and the contact plugs 72 as well as the conductive layer 73 are formed, as shown in FIGS. 2 and 3. Each of the contact plugs 71 connects between the conductive layer 73 and the corresponding upper electrode 62, while each of the contact plugs 72 connects between the conductive layer 73 and the conductive lines 22. Thus, the phase change memory device 1 can be obtained.

Next explanation will be made about a phase change memory device 80 according to a second embodiment of the present invention, with further reference to FIGS. 20 to 25. The second embodiment is a modification of the above-mentioned first embodiment. In FIGS. 20 to 25, similar components, sections or portions are depicted with the same reference numerals as the first embodiment, and explanation therefor is omitted for the sake of better understanding of the present embodiment.

Figure 20:
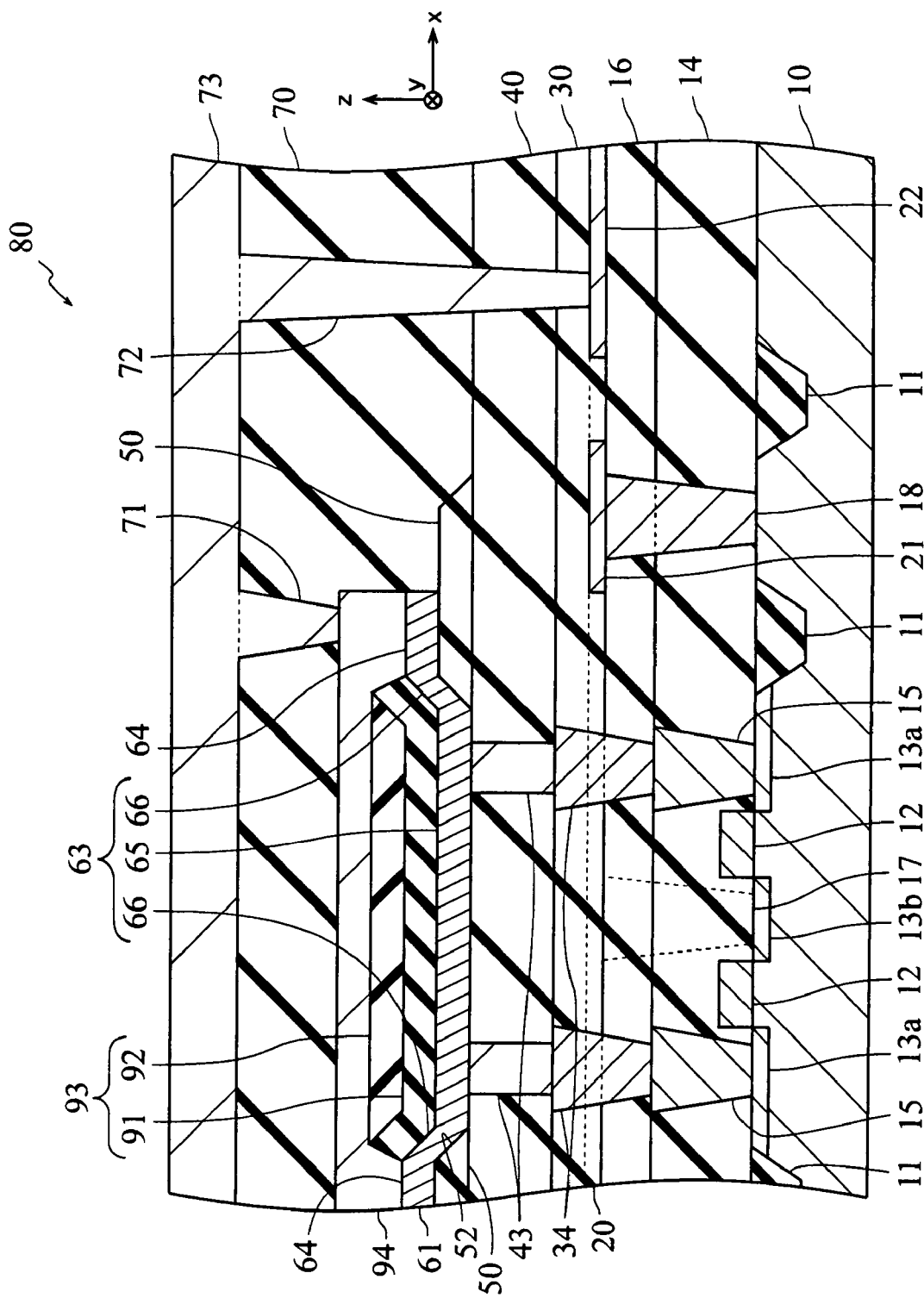
FIG. 20 is a cross-sectional view showing a phase change memory in accordance with another embodiment of the present invention.

With reference to FIG. 20, the phase change memory device 80 of the present embodiment comprises a heat insulation portion 93. The heat insulation portion 93 has a stacked structure that is constituted by a heat insulator layer 91 and another heat insulation layer 92. The top surface of the heat insulation portion 93 is laid on a higher level than the contact portion 64 of the phase change portion 61 so that each upper electrode 94 does not have a simple plate-like shape but have an uneven bottom surface. The phase change memory device 80 can be obtained as follows.

Figure 21:
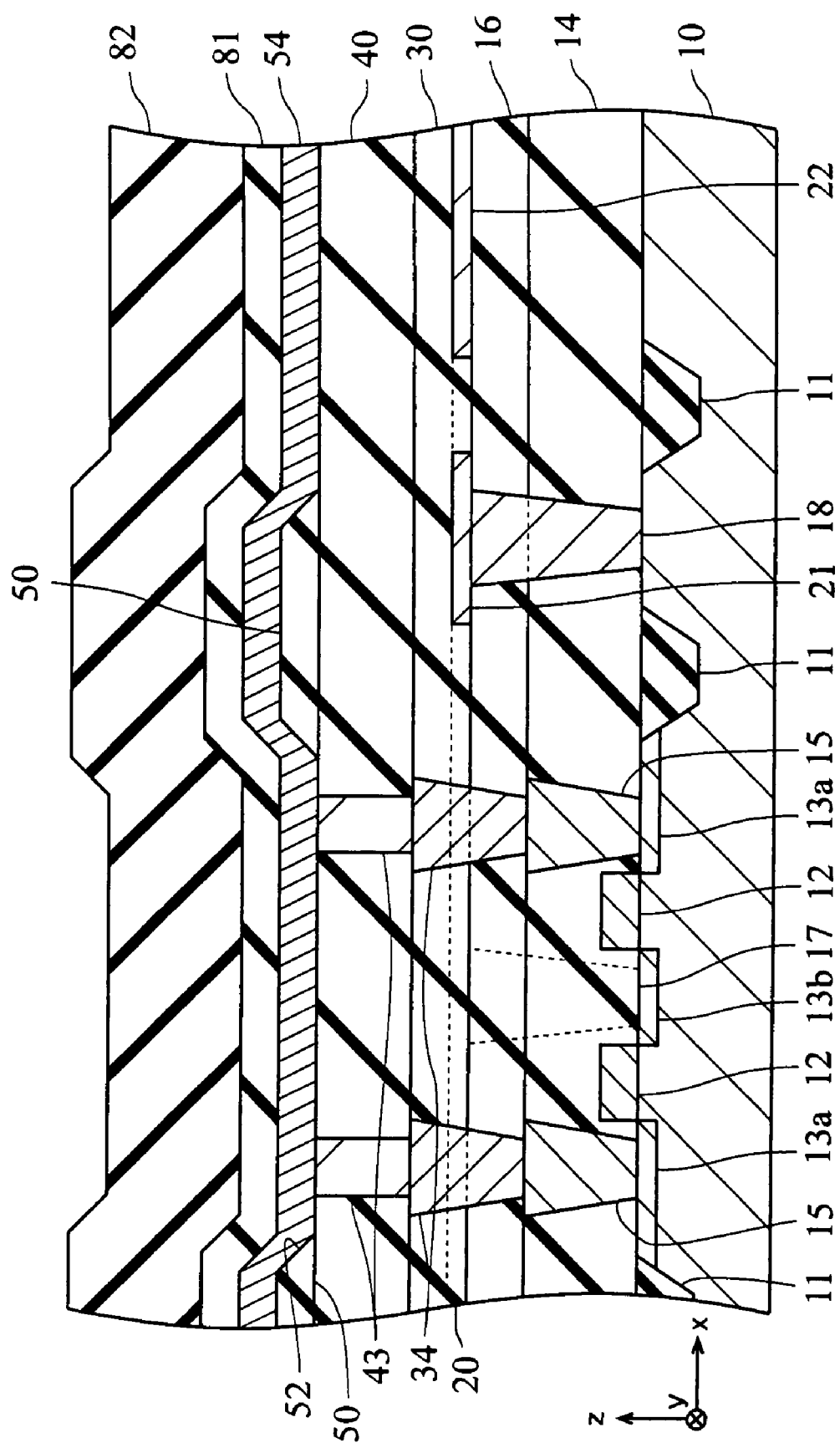
FIG. 21 is a cross-sectional view showing a fabrication process for the phase change memory device of FIG. 20.

Similar to the state of FIG. 15, the holes 52 are formed in the insulator layer 50 so that the heater pillars 43 can be seen from the above. Next, a GST material is deposited on the insulator layer 50 including the holes 52, to form a GST film 54 of 100 nm. On the GST film 54, a silicon nitride material is deposited to form a first insulation material layer 81 of 100 nm. The first insulation material layer 81 has a plurality of concave portions on the concave portions of the GST film 54. On the first insulation material layer 81, a silicon oxide material is deposited to form a second insulation material layer 82 of 2100 nm, as shown in FIG. 21.

Figure 22:
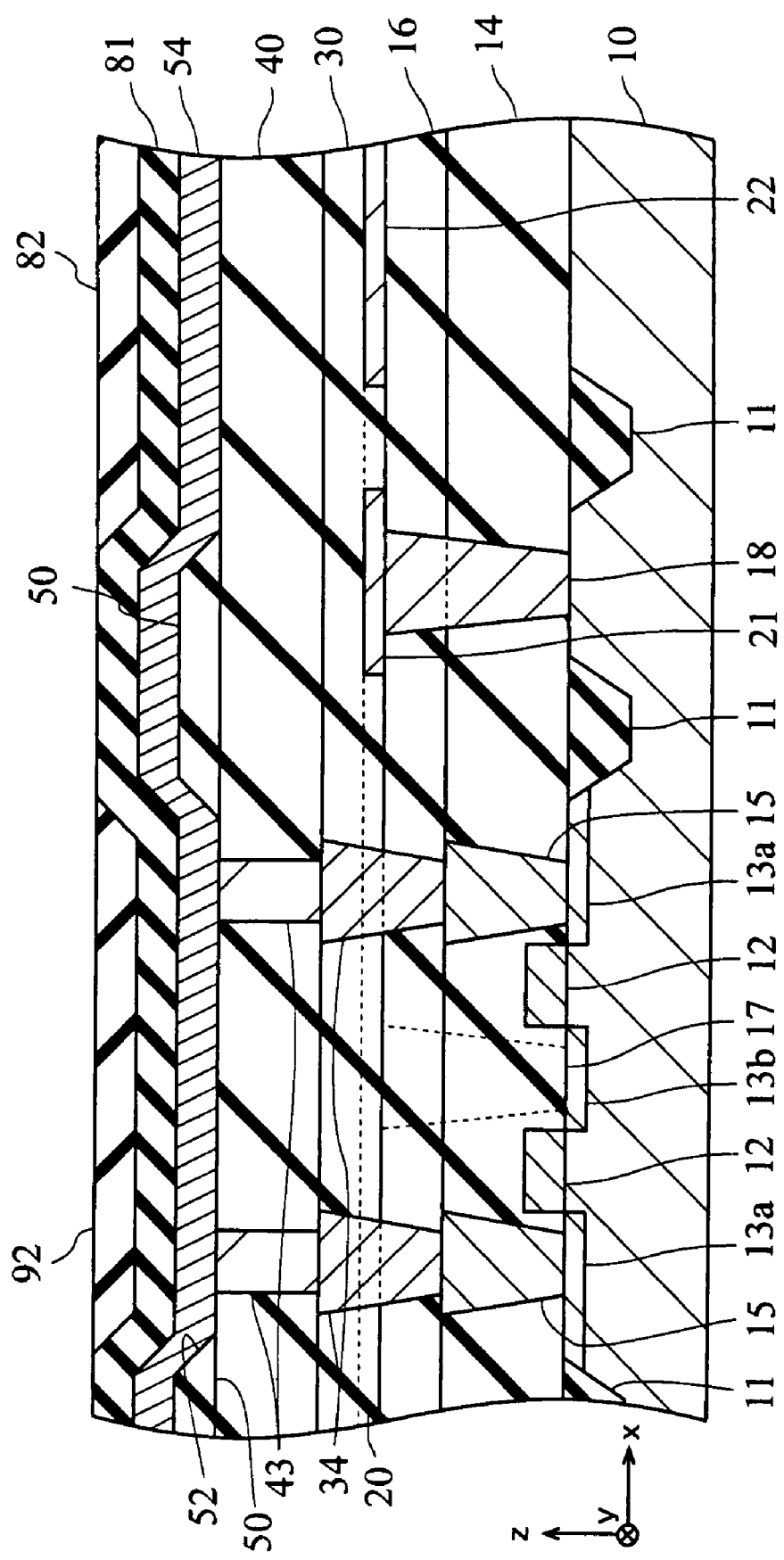
FIG. 22 is a cross-sectional view showing a subsequent fabrication process for the phase change memory device of FIG. 20.

Next, the second insulation material layer 82 is subjected to a CMP process by using the first insulator material layer 81 as a stopper, so that the heat insulation layers 92 are formed in the concave portions of the first insulation material layer 81, as shown in FIG. 22. Each of the heat insulation layers 92 is surrounded by the first insulation material layer 81 as seen from the above.

Figure 23:
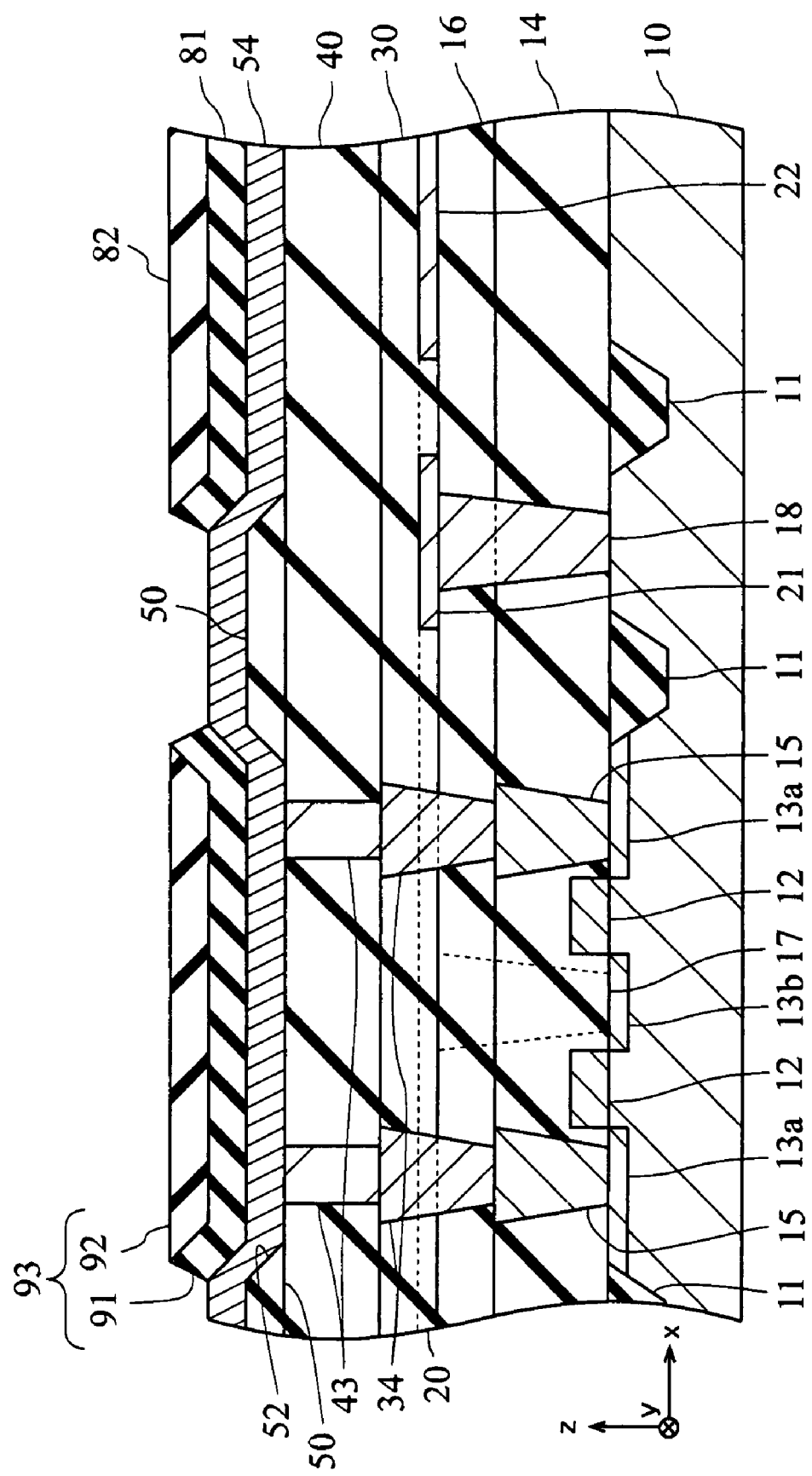
FIG. 23 is a cross-sectional view showing a subsequent fabrication process for the phase change memory device of FIG. 20.

Next, the first insulation material layer 81 is partially etched back to the GST film 54 by using the heat insulation layers 92 as masks, so that the heat insulation layers 91 are formed in the concave portions of the GST film 54, as shown in FIG. 23. Thus, the heat insulation portions 93 of the stacked structure are obtained.

Figure 24:
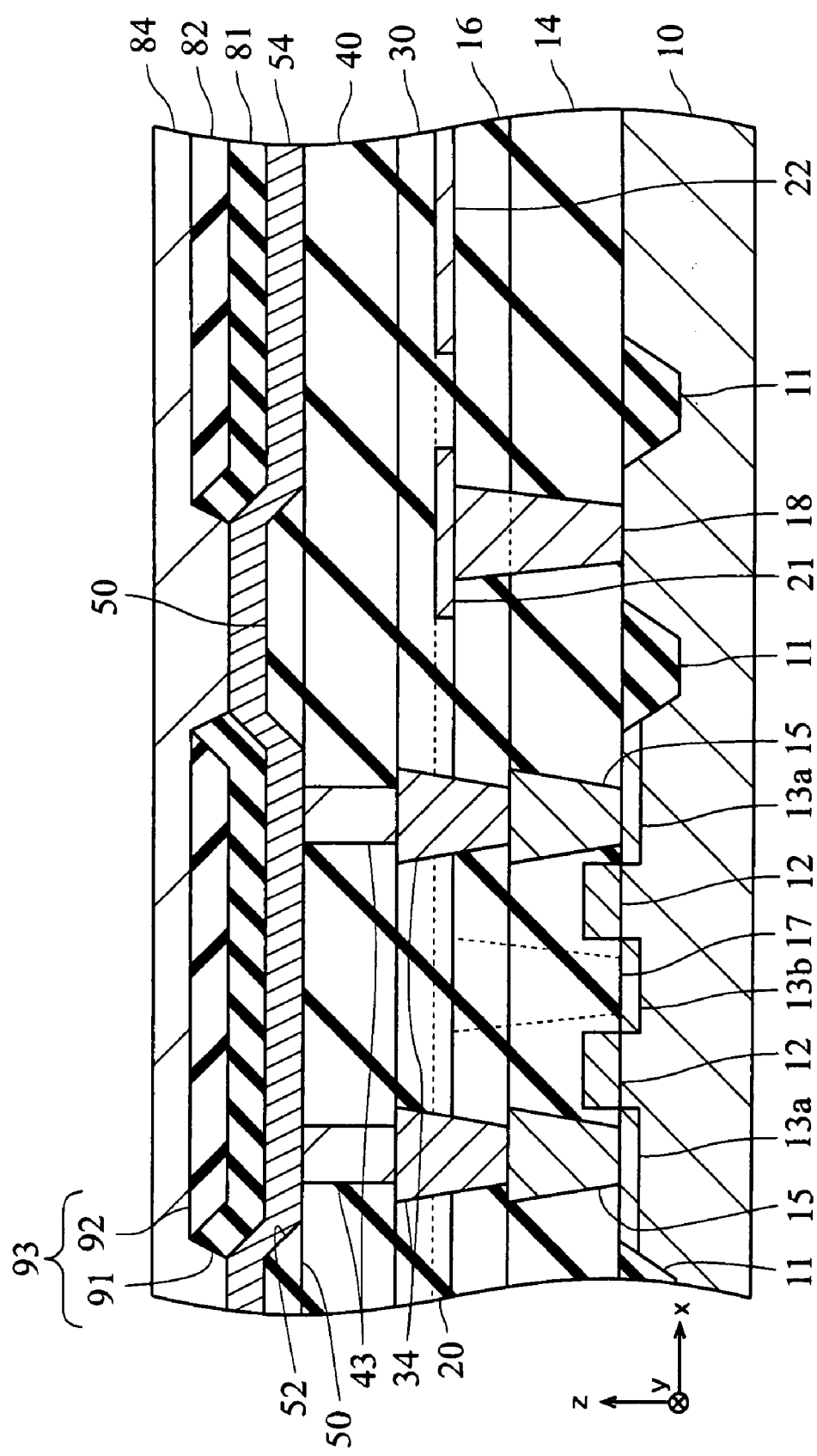
FIG. 24 is a cross-sectional view showing a subsequent fabrication process for the phase change memory device of FIG. 20.

Next, an electrode material, tungsten (W), is deposited on the GST film 54 and on the heat insulation layer 92 to form an electrode material layer 84 of 50 nm, as shown in FIG. 24.

Figure 25:
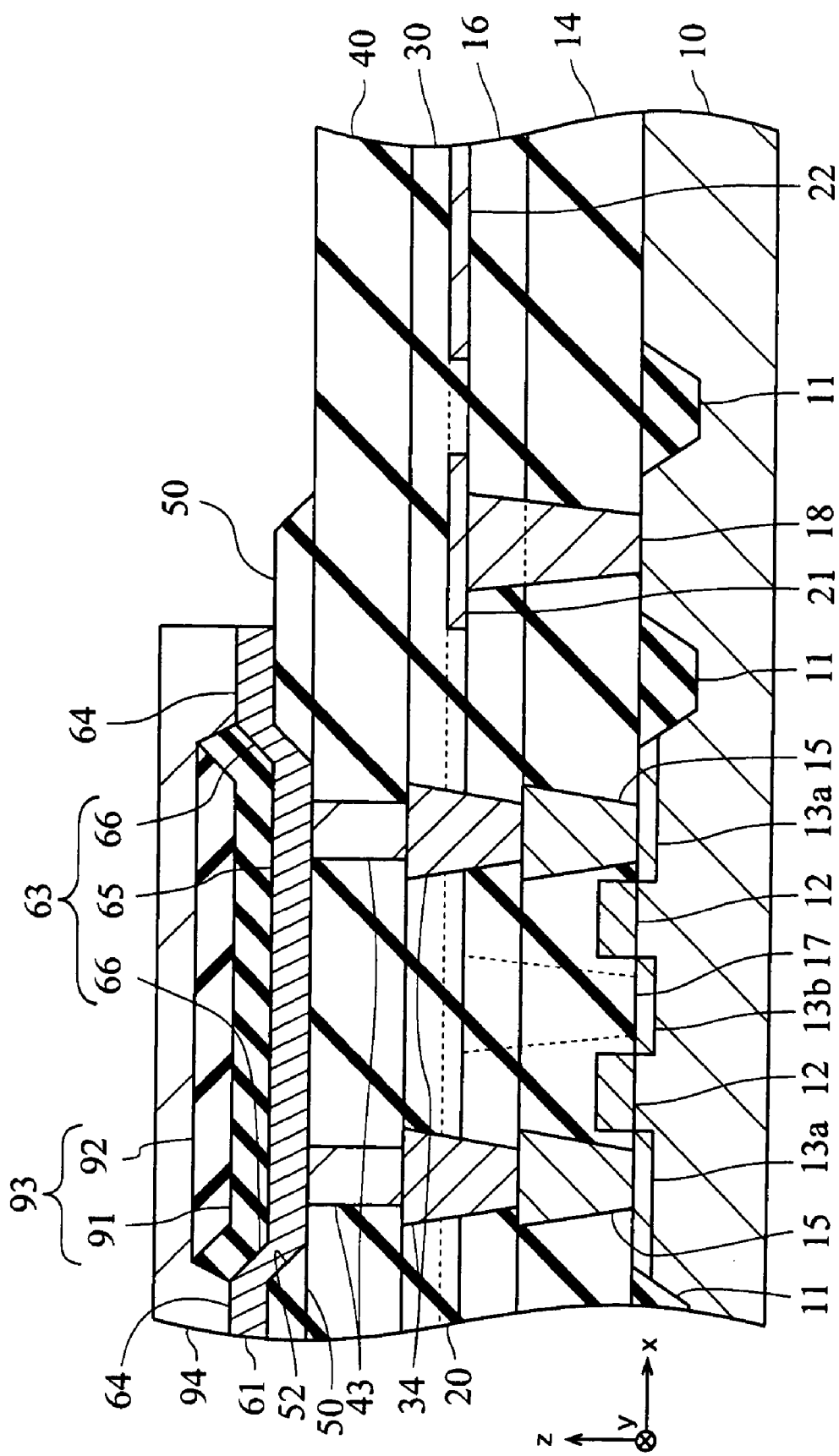
FIG. 25 is a cross-sectional view showing a subsequent fabrication process for the phase change memory device of FIG. 20.

Next, the electrode material layer 84 and the GST film 54 are partially etched to form the upper electrodes 94 and the phase change portions 61, as shown in FIG. 25. The heat insulation portion 93, i.e. the heat insulation layers 91, 92 are completely and hermetically enclosed only by the phase change portions 61 and the upper electrodes 94.

Next, the insulator layer 70 is formed on the upper electrodes 94 and the insulator layers 40, 50. Then, the contact plugs 71 and the contact plugs 72 as well as the conductive layer 73 are formed, as shown in FIGS. 2 and 20. Each of the contact plugs 71 connects between the conductive layer 73 and the corresponding upper electrode 94, while each of the contact plugs 72 connects between the conductive layer 73 and the conductive lines 22. Thus, the phase change memory device 80 can be obtained.

The present application is based on Japanese patent applications of JP2006-172077 filed before the Japan Patent Office on Jun. 22, 2006, the contents of which are incorporated herein by reference.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. A semiconductor device comprising:
a first insulating layer having an upper surface;
a heater electrode embedded into the first insulating layer such that an upper surface of the heater electrode is substantially coplanar with the upper surface of the first insulating layer;
a second insulating layer formed on the first insulating layer, the second insulating layer including a hole that exposes the upper surface of the heater electrode and a first part of the upper surface of the first insulating layer around the upper surface of the heater electrode;
a phase change layer including a first portion that is formed in contact with the upper surface of the heater electrode and with the first part of the upper surface of the first insulating layer through the hole, the phase change layer further including a second portion that is elongated from the first portion over a part of the second insulating layer;
an upper electrode including a first part that is in contact with the second portion of the phase change layer, the upper electrode further including a second part that is elongated from the first part over the first portion of the phase change layer with a gap therebetween; and
a heat isolation layer formed between the first portion of the phase change layer and the second part of the upper electrode to fill the gap.

2. The device as claimed in claim 1, wherein the heat isolation layer is formed such that an upper surface thereof is substantially coplanar with an upper surface of the second portion of the phase change layer.

3. The device as claimed in claim 1, wherein the heat isolation layer comprises a plurality of insulation films different in material from each other.

4. The device as claimed in claim 1, wherein the hole comprises a tapered hole.

5. The device as claimed in claim 1, wherein
the heater electrode comprises a first heater electrode, and the device further comprises a second heater electrode that is embedded into the first insulating layer such that an upper surface of the second heater electrode is substantially coplanar with the upper surface of the first insulating layer;
the hole of the second insulating layer further exposing the upper surface of the second heater electrode and a second part of the upper surface of the first insulating layer around the upper surface of the second heater electrode,
the first portion of the phase change layer being elongated to be in contact with the upper surface of the second heater electrode and with the second part of the upper surface of the first insulating layer,
the phase change layer further including a third portion that is elongated from the first portion over another part of the second insulating layer separately from the second portion; and
the upper electrode further including a third part that is in contact with the third portion of the phase change layer and merged with the second part of the upper electrode.

6. The device as claimed in claim 5, further comprising first and second driving elements connected respectively to the first and second heater electrodes, the phase change layer being thereby used in common to the first and second driving elements.

7. The device as claimed in claim 6, wherein the first driving element comprises a first transistor and the second driving element comprises a second transistor, one of source and drain electrodes of the first transistor being connected to the first heater electrode, one of the source and drain electrodes of the second transistor being connected to the second heater electrode, and the other of the source and drain electrodes of the first transistor being connected to the other of the source and drain electrodes of the second transistor.

* * * * *